United States Patent
Koo et al.

(10) Patent No.: US 6,876,266 B2
(45) Date of Patent: Apr. 5, 2005

(54) LC OSCILLATOR WITH WIDE TUNING RANGE AND LOW PHASE NOISE

(75) Inventors: Yido Koo, San Jose, CA (US);
Jeong-Woo Lee, San Jose, CA (US);
Joonbae Park, San Jose, CA (US);
Kyeongho Lee, San Jose, CA (US)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 10/443,835

(22) Filed: May 23, 2003

(65) Prior Publication Data

US 2003/0227340 A1 Dec. 11, 2003

Related U.S. Application Data

(60) Provisional application No. 60/386,741, filed on Jun. 10, 2002.

(51) Int. Cl.[7] .................................................. H03B 5/00
(52) U.S. Cl. .............................. 331/117 R; 331/117 FE; 331/167; 331/36 C; 331/185; 331/177 V; 331/177 R; 331/175
(58) Field of Search ....................... 331/117 R, 117 FE, 331/167, 185, 36 C, 177 V, 177 R, 175, 179

(56) References Cited

U.S. PATENT DOCUMENTS

| | | | | |
|---|---|---|---|---|
| 5,175,884 | A | 12/1992 | Suarez | 455/260 |
| 5,477,194 | A | * 12/1995 | Nagakura | 331/10 |
| 5,739,730 | A | 4/1998 | Rotzoll | 331/177 V |
| 5,936,474 | A | 8/1999 | Rousselin | 331/34 |
| 5,963,100 | A | 10/1999 | Tolson et al. | 331/17 |
| 6,137,372 | A | 10/2000 | Welland | 331/117 R |
| 6,593,826 | B2 | * 7/2003 | See | 331/179 |
| 6,661,301 | B2 | * 12/2003 | Traub | 331/117 R |

* cited by examiner

*Primary Examiner*—Arnold Kinkead
(74) *Attorney, Agent, or Firm*—Fleshner & Kim, LLP

(57) ABSTRACT

A voltage-controlled oscillator including an active oscillator circuit, an inductor, and capacitive circuits is disclosed. The capacitive circuits are selectively turned on and off to control the frequency of the voltage-controlled oscillator. Particularly, the inductor and the capacitors in the capacitive circuits form LC circuits that provide feedback to the active oscillator circuit. To avoid damage to the switches in the capacitive circuits, the capacitive circuits further comprise resistors. The resistors can be configured in several different ways so that the voltage-controlled oscillator can have a high degree of reliability, and a wide tuning range with constant phase noise performance.

50 Claims, 10 Drawing Sheets

LC OSCILLATOR WITH WIDE TUNING RANGE AND LOW PHASE NOISE

This application claims priority to U.S. Provisional Application No. 60/386,741, filed Jun. 10, 2002, which is incorporated by reference in its entirety.

BACKGROUND OF THE INVENTION

1. Field of the Invention

The invention relates generally to the field of wireless communications, and more particularly to a voltage-controlled oscillator of a phase locked loop circuit.

2. Background of the Related Art

Phase Locked Loops (PLLs) have wide application in areas such as wireless communications systems and other products. In many applications, the PLL has very stringent performance requirements. There can be more than one PLL circuit 110, 120 in a typical wireless system. For example, a typical block diagram of a receiver using a super-heterodyne architecture 100 is shown in FIG. 1. Those skilled in the art will readily recognize the various blocks and their functions, so a detailed recitation of the block diagram will not be further described herein.

PLLs used in wireless communication systems provide a highly stable carrier signal for the modulation and the demodulation processes. The carrier signal should have sufficient spectral purity (often represented as phase noise characteristics of the voltage-controlled oscillator (VCO) in the PLL) and support the required channel spacing in the desired band. For example, Korean cellular phone standards include the IS-95 Standard For Code Division Multiple Access (CDMA) digital service at around 900 MHz and 1700 MHz. European cellular phone standards include the Global System For Mobile Communications (GSM) operating in the 900 MHz band and Defense Communications System (DCS) in the 1800 MHz range. Although the occupied frequency band is similar, the required channel spacing for the PLL differs according to the particular standard. For example, IS-95 standard requires 1.25 MHz channel spacing with a 10 KHz channel raster. On the other hand, GSM and DCS standards require 200 KHz channel spacing in the allocated frequency bands. Since the PLL in the wireless communication transceiver generates the appropriate very high frequency (VHF) signal with high accuracy, the PLL can use a highly stable Voltage-controlled Temperature Compensated Crystal Oscillator (VCTXO) as the reference clock.

FIG. 2 shows a generic block diagram of a PLL commonly used in wireless communication equipment. As shown therein, the PLL includes a reference divider 202, a feedback divider 210, a voltage-controlled oscillator (VCO) 208, a phase frequency detector (PFD) 204, a charge pump circuit (not shown) and a loop filter (LF) 206. The PFD 204 compares the phase of the divided reference clock signal and the divided output of the VCO 208. Depending upon the magnitude and polarity of the phase error, the charge pump circuit generates UP or DOWN signals at its output, where the width of the pulses are proportional to the detected phase error. The charge pump circuit generates an amount of the charge equivalent to the error signal. The net charge is accumulated at the LF 206, which serves as a control signal of the VCO 208. A simple form of the LF 206 is a series combination of a resistor and a capacitor (i.e., a first order filter). However, in modern PLL design, higher order loop filters can be used to get better performance in phase noise and spurious response. The resulting voltage from LF 206 is connected to a frequency control terminal of the VCO 208. Due to the negative feedback loop, the PLL of FIG. 2 achieves a stable output frequency. The stable output frequency situation will exist when the net change of the loop filter 206 voltage becomes zero. At this point, the frequency and the phase of the VCO 208 do not change, on average. In this locked state, the frequency of the VCO 208 is simply expressed as follows.

$$f_{vco} = \frac{L}{N} f_{REF} \qquad (1)$$

Where $f_{vco}$=the VCO frequency, L=the feedback divider, N=the reference divider, and $f_{ref}$=the reference frequency. In the above equation (1), the coefficient of the feedback divider can be integer, but also can contain some fractional part in some applications.

There are numerous factors in designing PLL circuits for specific applications. The common factors are circuit area, cost, and power consumption. Performance characteristics such as lock time and phase noise depend on the system in which the PLL is used. According to the system requirements, design parameters such as division factors, loop bandwidth, and circuit design are affected. For example, in GSM applications, 200 KHz channel spacing with 13 MHz reference frequency is required, with a lock time of several msec. Thus, an integer-N frequency synthesizer and normal loop bandwidth can be used to meet the requirement. However, in General Packet Radio Service (GPRS) applications, the generic integer-N frequency synthesizer cannot be used, because a lock time of less than 150 μs is required. In this case, fractional-N synthesizer or sigma-delta based synthesizers are commonly used.

In other applications, required frequency resolution in the PLL is 10 KHz, even though the channel spacing is 1.25 MHz. There are several reasons for this. First, the most common reference frequency in IS-95 applications is 19.2 MHz, which is not a multiple of 1.25 MHz. Second, the required frequency resolution depends on the choice of the Intermediate Frequency (IF) signal when the PLL is used in a super-heterodyne transceiver. Where the common IF frequency is 85.38 MHz in the receiving mode, the frequency resolution should be 10 KHz in the local oscillator. Third, compatibility with old standards such as Advanced Mobile Phone Service (AMPS) requires the frequency resolution of 10 KHz in generating the local oscillator (LO) signal.

The performance of the related art PLL is limited by that of the VCO 208, and important characteristics of the VCO 208 include the phase noise performance. The remaining components such as the PFD 204 and frequency dividers 202 and 210 also contribute to the overall noise performance of the PLL output. Phase noise is usually defined as the ratio of the carrier power to the sideband power in 1 Hz at the specific offset frequency from the carrier. Phase noise has the unit of dBc/Hz. The VCO 208 is a sensitive device, and its phase noise performance characteristic may be greatly affected by environmental conditions such as power supply variation, temperature and noise. A factor representing the sensitivity of the VCO 208 is its gain, usually expressed as Kvco (MHz/V). For low-noise PLL applications, the VCO 208 can have a relatively low gain, thus low sensitivity. The low gain of the VCO 208 reduces the effect of the external noise by minimizing the AM-to-FM modulation.

Since the phase noise specification in mobile phone applications is so stringent, the allowable types of the VCO are limited, and an LC oscillator is usually used. The LC oscillator consists of a resonant tank circuit and a few active devices to compensate the energy loss in the tank circuit. Since the tank circuit is a type of band-pass filter, the phase noise performance of the LC oscillator is better than other types of oscillators. The nominal frequency of the LC oscillator is expressed as follows.

$$f_{vco} = \frac{1}{2\pi\sqrt{LC}} \quad (2)$$

In equation 2, $f_{vco}$=the nominal frequency of the VCO, L=the inductance, and C=the capacitance. There are two possibilities for controlling the frequency of the VCO. However, since the formation of a variable inductor is not easy, a variable capacitor can be used for controlling the frequency of the VCO.

It was common to design the VCO with a discrete tank circuit, some passive components and active devices. But this approach leads to large circuit area and high cost. There is a recent trend that drives those functional blocks into the monolithic form. The most difficult factor in the design of a fully integrated LC oscillator is to guarantee stable operation against process and environmental variations. The variation of a capacitor or inductor grown above silicon exceeds 10% in a worst case. Referring to equation (2), it is seen that the percentage of change in the operating frequency also becomes 10% in that case. Thus, the total operating range of the VCO should cover this frequency shift as well as the desired frequency range. However, the wide tuning range conflicts with the design goal of small gain in order to achieve low phase noise characteristics.

The above-described trade-off between the low phase noise and the wide tuning range has been solved with various discrete tuning methods. FIG. 3 shows a schematic of a VCO according to the related art. The resonant LC circuit 310 controls the frequency of the oscillator 300. LC circuit 310 includes a capacitor 312, inductor 314, varactor diodes 316 and 320, and switches 318. In operation, when a lock is not achieved in the PLL, the varactor diodes 316 are selectively switched to control the frequency of the VCO. When the operating frequency of the VCO is faster than the desired frequency, more switches are closed to reduce the operating frequency of the VCO, and vice versa. In the related art circuit of FIG. 3, the value of capacitor 312 is of little significance because of the capacitance of varactor diodes 316 and 320.

The LC circuits of related art VCO's have various disadvantages. For example, referring to FIG. 3, there is no DC current path in the off-state of switch 318. Thus, a bias level of a floated terminal of a corresponding diode 316 is unknown and very sensitive to the leakage. When an initial bias condition of such a floated terminal is too high or low, it can greatly affect the device reliability.

FIGS. 4, 5A, and 5B show similar related art VCO's, except in a differential implementation, and where an equivalent capacitor has been substituted for each varactor diode. As shown in FIG. 4, all switches except SW(1) and SWB(1) are closed, and thus our concern is focused on the behavior of the floated nodes NSC(1) and NSCB(1). Where the initial bias voltage of the floated terminal is assumed to be same as the common mode voltage of the oscillator, the waveform of the floated terminal is almost same as the waveform of the oscillator output, and little or no degradation in performance is presented.

However, FIG. 5A illustrates the case in which some amount of the positive charge is stored in the capacitor plate connected to NSC(1) just after disconnection of the switch SW(1), and where some amount of the negative charge is stored at the other plate of capacitor SCB(1). Because there is no DC current path during the off-state, there is a positive offset voltage between the NSC(1) node and the OUT node. Where the offset voltage is excessive, the switches may be damaged, and the reliability of the VCO may be degraded.

FIG. 5B illustrates another undesirable situation. When an NMOS switch is used to control the switchable capacitor, the drain junction can be forward-biased. Since this kind of parasitic junction has a very poor quality factor, the phase noise performance in this case will be severely degraded.

Other problems and disadvantages also exist as will be appreciated by those skilled in the art. U.S. Pat. Nos. 6,137,372 and 5,739,730 are examples of related art systems.

The above references are incorporated by reference herein where appropriate for appropriate teachings of additional or alternative details, features and/or technical background.

SUMMARY OF THE INVENTION

As embodied and broadly described herein, there is provided devices and methods that overcome the above-noted deficiencies of the prior art. Accordingly, embodiments of the present invention provide a system comprising: at least one adjusting circuit operably coupled to an oscillator, wherein the adjusting circuit comprises: a resistor; a reactive element; and a first switch, wherein the first switch is in series with the reactive element and couples and decouples the reactive element to an output of the oscillator, and wherein the resistor provides a bias voltage to the reactive element so that the reactive element has a bias voltage when the first switch is open.

Further, embodiments of the present invention provide an apparatus comprising: an active oscillator, wherein the active oscillator comprises a first output node and a second output node; an inductor, wherein the inductor couples the first output node and the second output node; and at least one capacitive circuit coupled to either the first output node or the second output node, each capacitive circuit comprising: a capacitor; a resistor; and a first switch, wherein the resistor provides a bias voltage to the capacitor when the first switch is open and wherein the first switch is in series with the capacitor and couples and decouples the capacitor to the output of the oscillator.

Additionally, embodiments of the present invention provide a method for tuning an oscillator circuit, the method comprising: providing a bias voltage via a resistor to a reactive element so that the reactive element has a bias voltage when a first switch is open; and using the first switch to couple and decouple the reactive element from the oscillator, thereby adjusting the frequency of the oscillator.

Additional advantages, objects, and features of the invention will be set forth in the description which follows and will become apparent to those having ordinary skill in the art upon examination of the following description.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
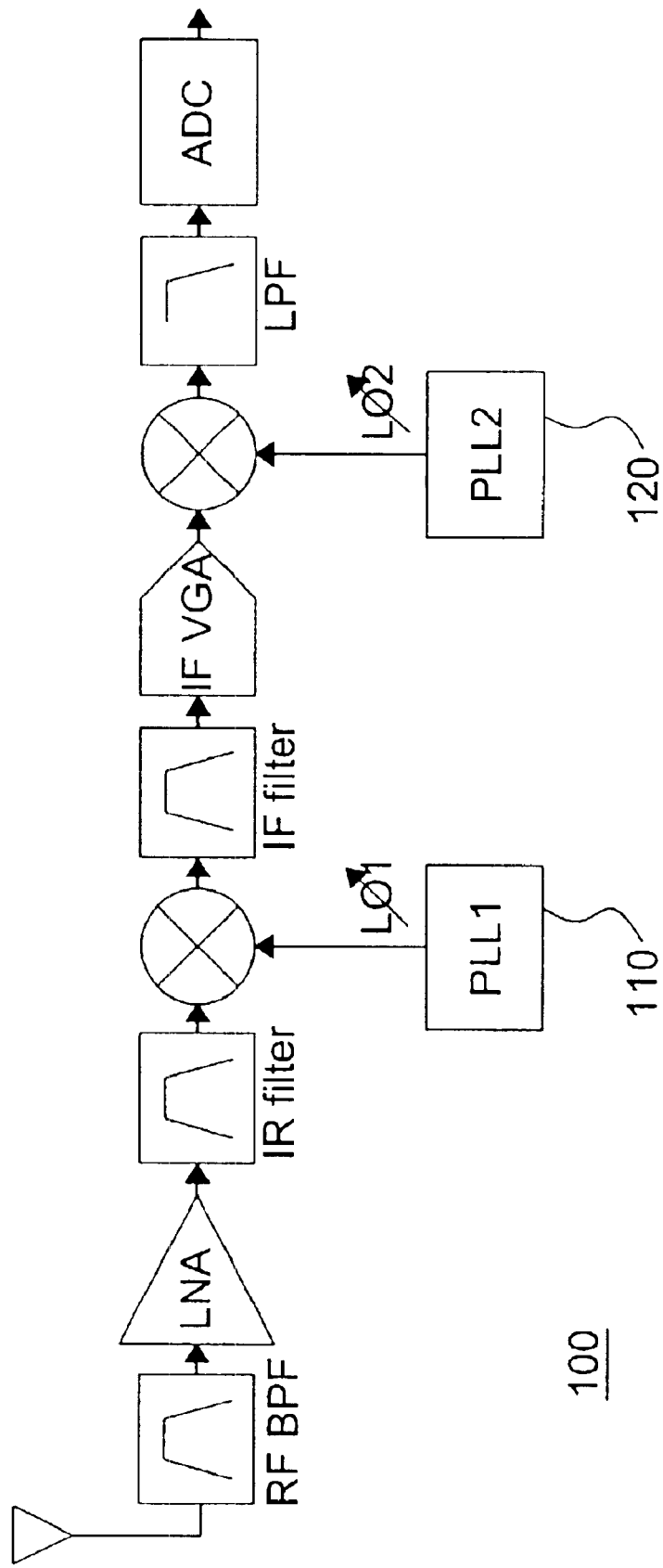
FIG. 1 is block diagram of a super-heterodyne receiver, according to the related art.
Figure 2:
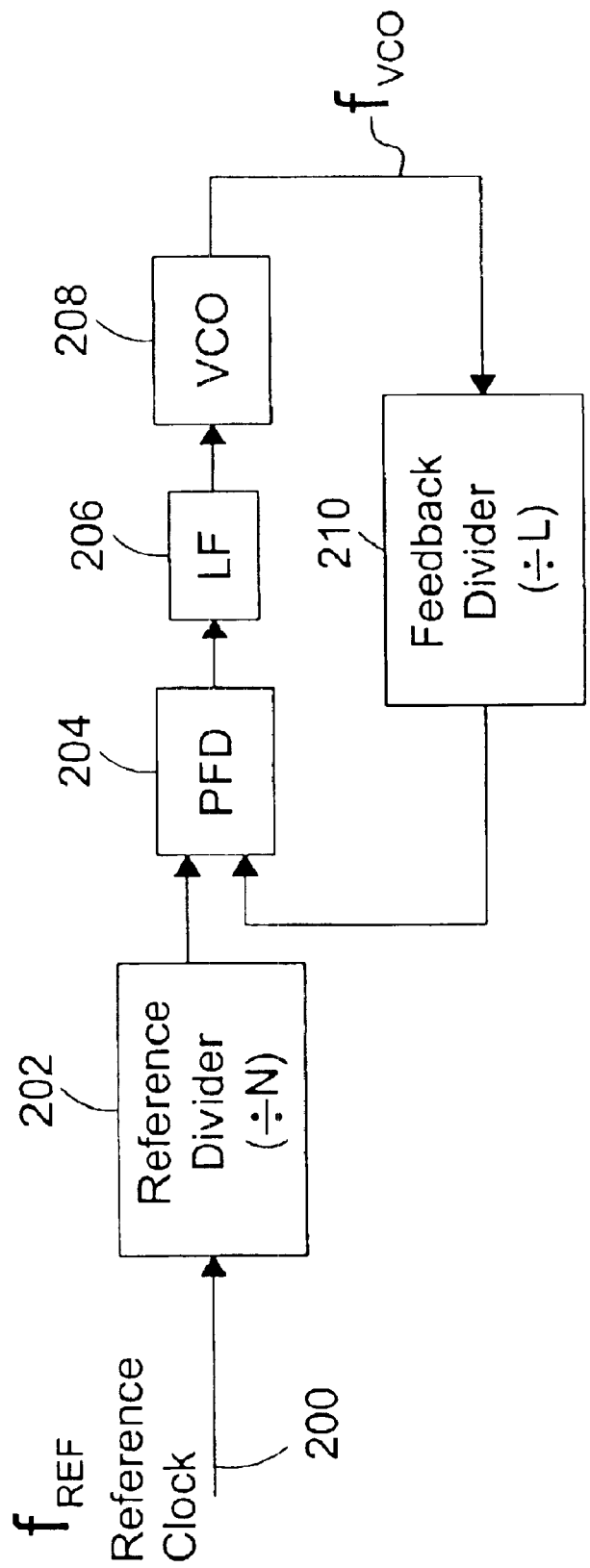
FIG. 2 is block diagram of a related art phase locked loop.
Figure 3:
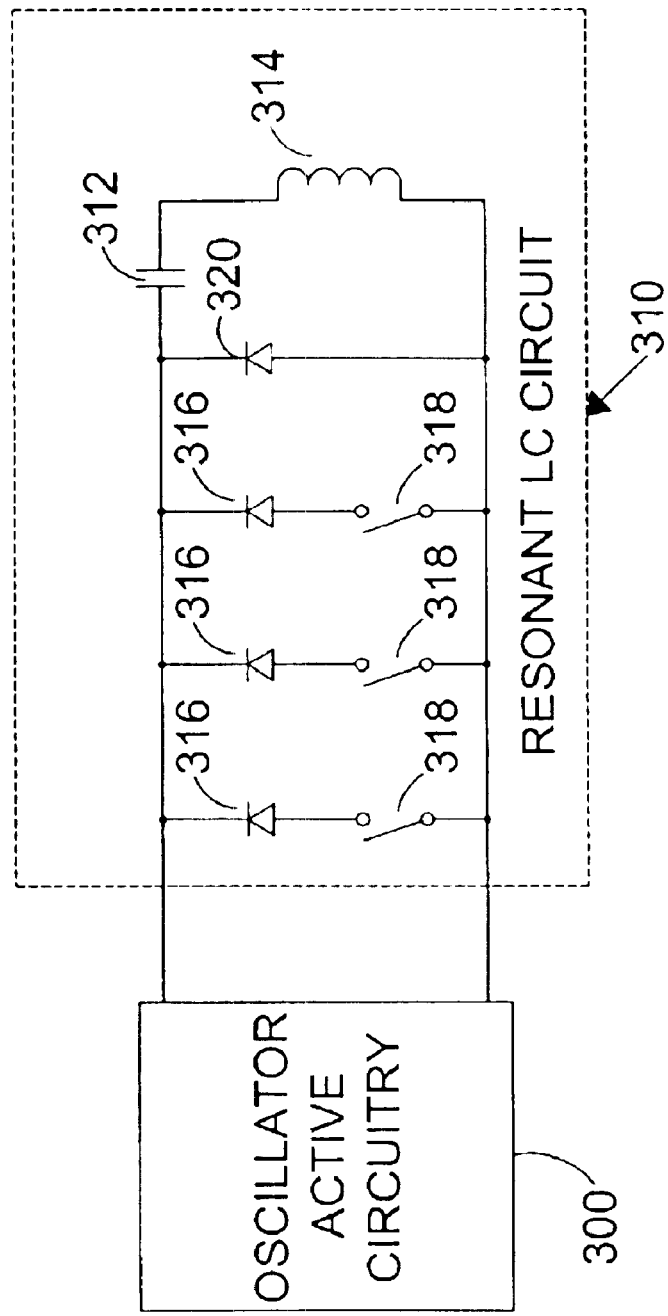
FIG. 3 is a schematic diagram of a related art voltage-controlled oscillator.
Figure 4:
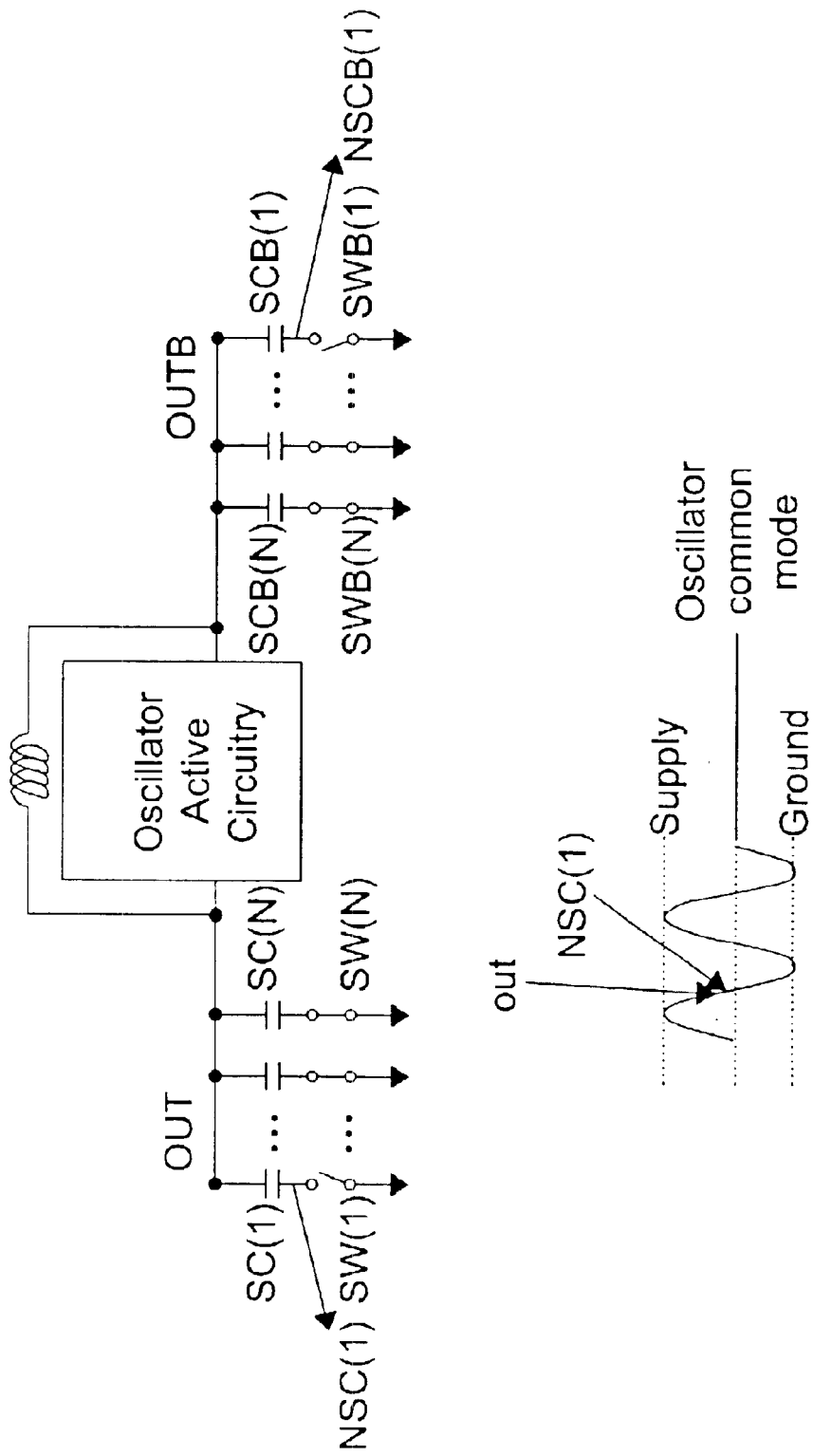
FIG. 4 is an operating illustration of the related art voltage-controlled oscillator according to a first mode of operation.
Figure 5A:
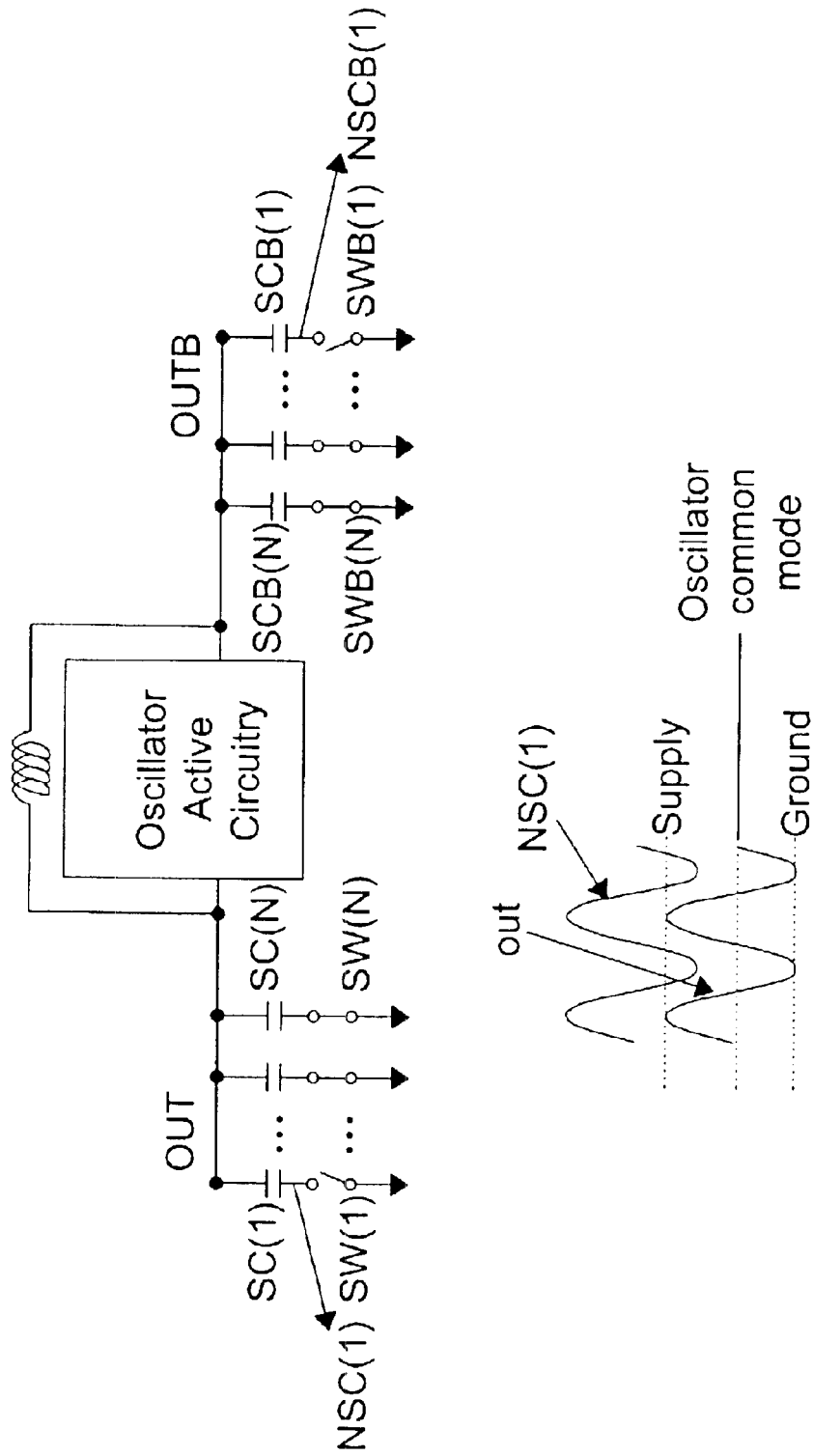
FIG. 5A is an operating illustration of the related art voltage-controlled oscillator according to second mode of operation.
Figure 5B:
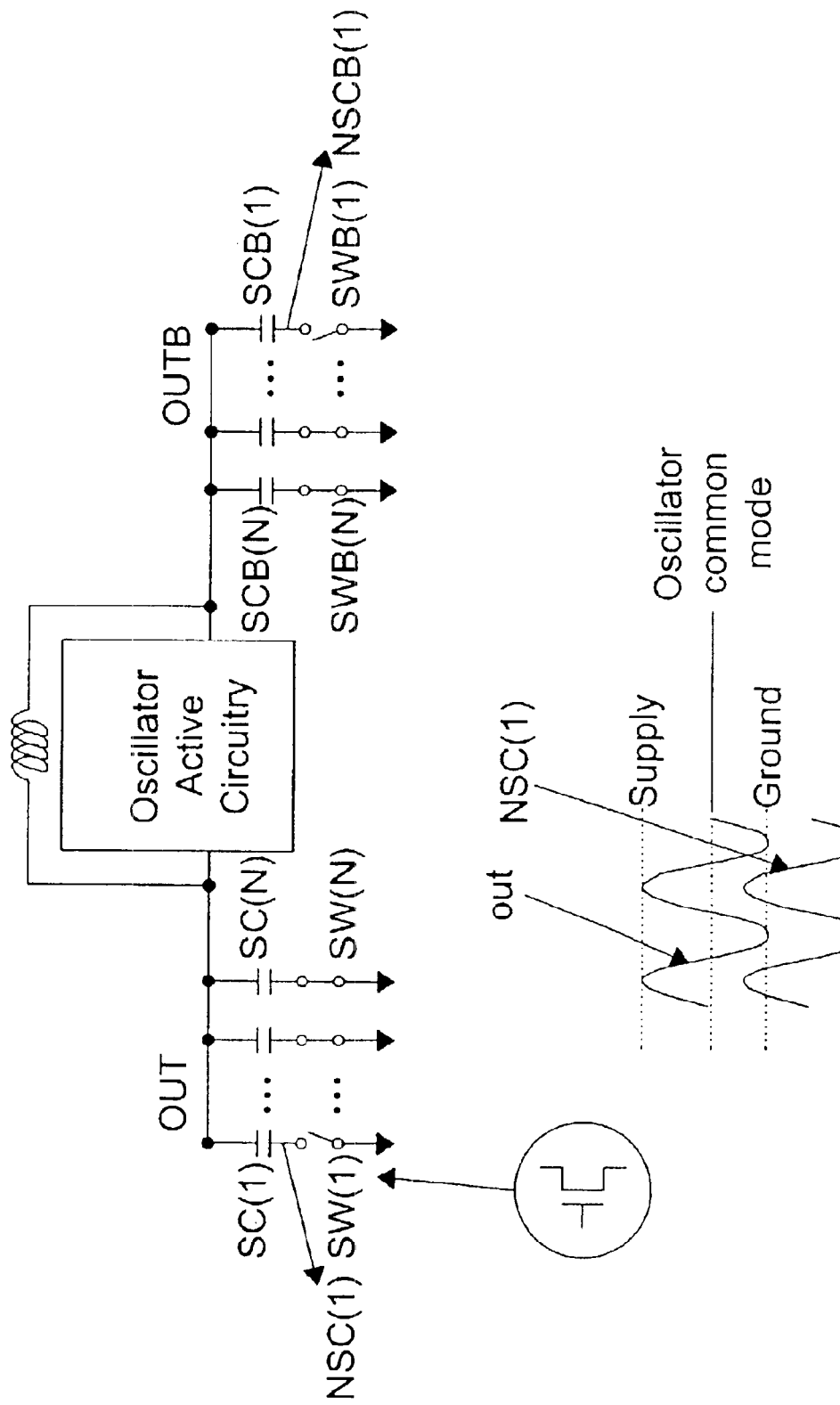
FIG. 5B is an operating illustration of the related art voltage-controlled oscillator according to a third mode of operation.
Figure 6:
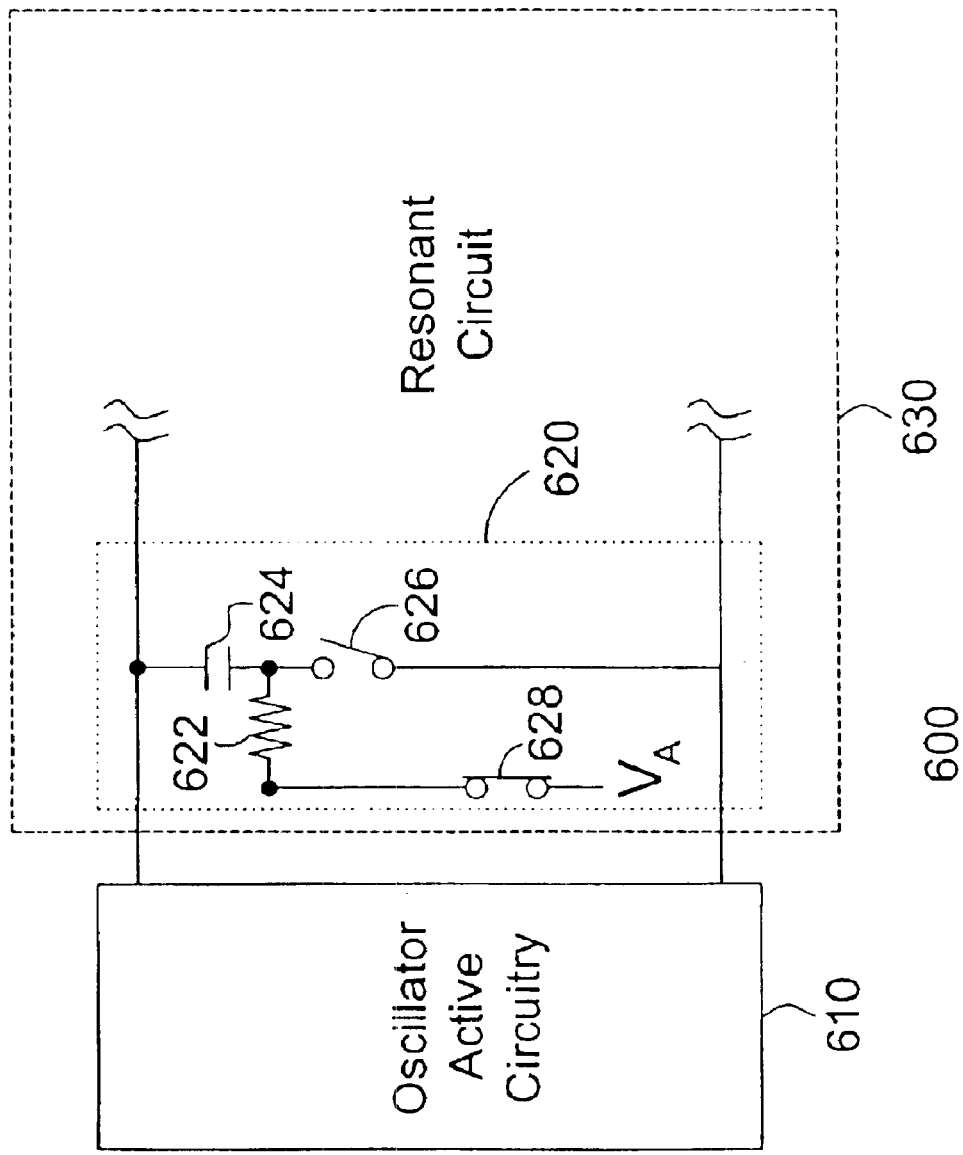
FIG. 6 is an illustration of a voltage-controlled oscillator according to embodiments of the present invention.

FIG. 6 is a block diagram illustrating an embodiment of the invention. An oscillator circuit 600 includes an oscillator 610 and at least one adjusting circuit 620 operably coupled to the oscillator 610. The adjusting circuit includes a biasing resistor 622, a reactive element 624 (e.g., a capacitor) and a first switch 626. The first switch 626 selectively couples and decouples the reactive element 624 from the oscillator circuit 600. The biasing resistor 622 provides a bias voltage $V_A$ to the reactive element 624 so that the reactive element 624 has a bias voltage when the first switch 626 is open.

As discussed in detail in the following sections, the bias voltage $V_A$ can be supplied to the reactive element in a variety of configurations. For example, a biasing switch 628 can be located between the bias resistor 622 and the bias voltage $V_A$. The bias switch 628 selectively couples the bias resistor 622 to the bias voltage when the first switch 626 decouples the reactive element 624. The bias switch 628 selectively decouples the bias resistor 622 from the bias voltage $V_A$ when the first switch 626 couples the reactive element 624 to the oscillator circuit 600. Alternatively, the bias resistor 622 can be sized (e.g., a high resistance value) so that the bias voltage $V_A$ can be constantly coupled to the biasing resistor and so that the bias voltage $V_A$ does not substantially change the operating characteristics of the adjusting circuit when first switch 626 is closed.

The bias voltage $V_A$ can be connected to ground voltage, the supply voltage, or a common mode voltage of the oscillator output. Further, the bias voltage $V_A$ can be variable and can be selected from a range from ground voltage to supply voltage. Additionally, switches 626 and 628 can be semiconductor switching devices, such as transistors and the like.

As illustrated in FIG. 6, the adjusting circuit 620 is part of resonant circuit 630. Those skilled in the art will appreciate that resonant circuit 630 can contain additional elements such as inductors, capacitors and resistors. As first switch 626 is opened or closed, reactive element 624 is removed or added from the resonant circuit 630, respectively. Accordingly, the first switch 626 can alter the characteristics of the resonant circuit 630 and thus the frequency of the VCO. Further, additional adjusting circuits can be added to resonant circuit 630 to increase the range of control. Also, those skilled in the art will appreciate that the adjusting circuit of FIG. 6 can be used in either single ended or differential-type oscillators, since the increased tuning range and improved phase noise performance are beneficial to both types of oscillators.

Figure 7:
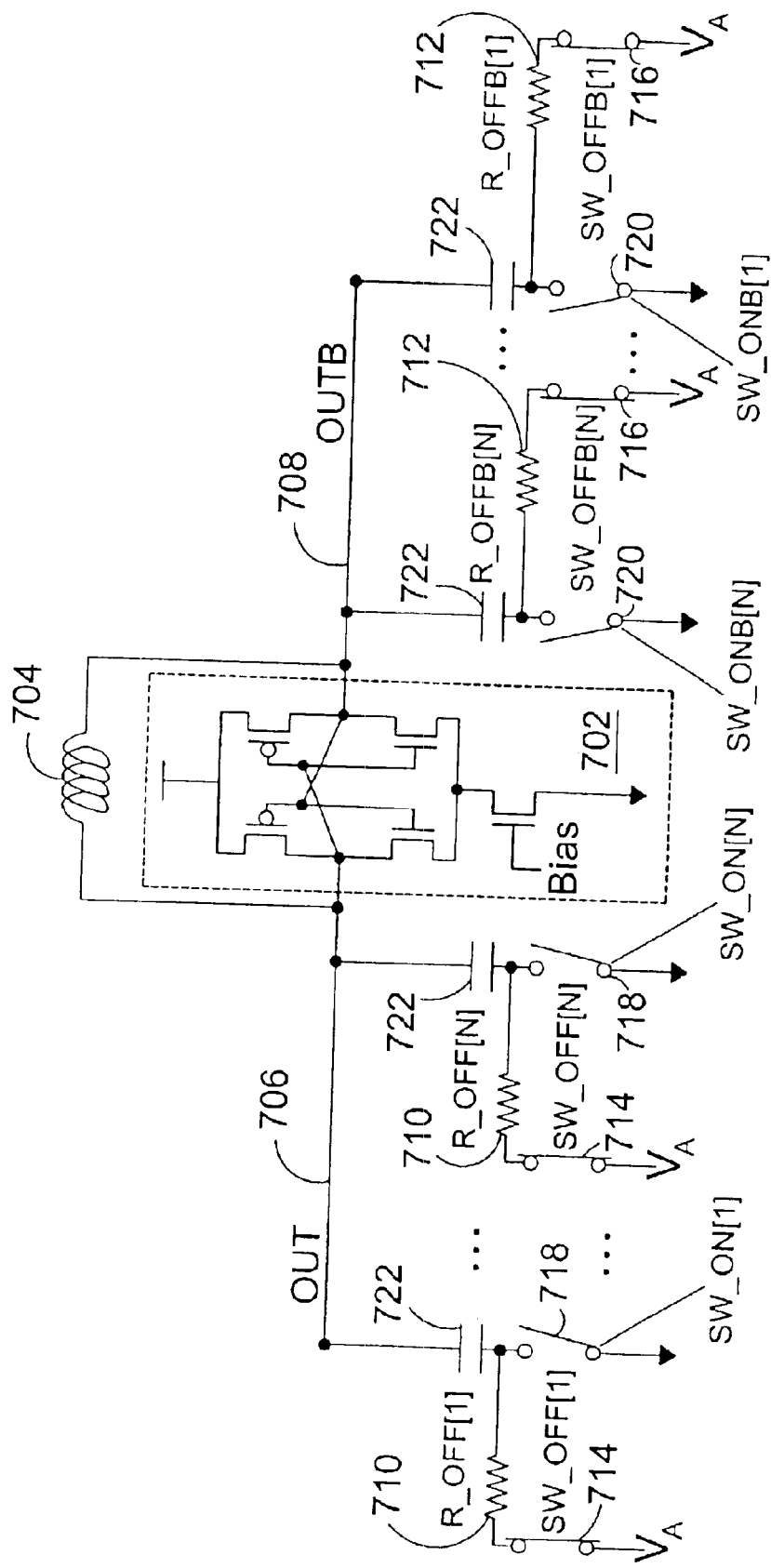
FIG. 7 is a schematic diagram of a voltage-controlled oscillator according embodiments of to the present invention.

FIG. 7 is a schematic diagram showing a voltage-controlled oscillator according to embodiments of the present invention. As shown in FIG. 7, the circuit preferably includes active oscillator circuitry 702. The circuit shown in FIG. 7 is a differential implementation having output nodes OUT 706 and OUTB 708. An inductor 704 is preferably coupled to the output nodes OUT 706 and OUTB 708. Two or more circuits having a capacitor 722 coupled in series with a switch 718 can also be coupled to OUT 706. The capacitor 722 is coupled to the output node 706 and switch 718. Switch 718 is preferably a transistor switch coupled to a reference voltage, which can be a ground voltage as shown in FIG. 7. In addition, the circuit preferably includes a series coupled resistance and switch such as an explicit resistor 710 coupled in series with transistor switch 714. The explicit resistor 710 is coupled at one end to a common node of capacitor 722 and transistor switch 718, and the transistor switch 714 is coupled between the other end of resistor 710 and a bias voltage $V_A$. Similar components and connections preferably exist with respect to the output node OUTB 708. For example, a capacitor 722 is preferably coupled in series with transistor switch 720, and the other terminal of the capacitor 722 is coupled to the output node OUTB 708. Further, one terminal of transistor switch 720 is coupled to ground. Moreover, there is preferably an explicit resistor 712 coupled in series with a transistor switch 716 such that the resistor 712 is coupled to a common node of the capacitor 722 and the transistor switch 720, and a terminal of the transistor switch 716 is coupled to the bias voltage $V_A$. Those skilled in the art will appreciate that capacitors 722 can have the same or different values. Likewise, the related resistors and switches can have the same or different values as determined by the specific design requirements of each application.

Operations of the circuit shown in FIG. 7 will now be described. Preferably, the value of the resistors 710 and 712 are determined or optimized for the best phase noise performance in the off-state. Since the resistor value is usually high (e.g., exceeding several kohm), there is no need for the low on-resistance of the transistor switches 714 and 716. Thus, the size of the transistor switches 714 and 716 can be very small. Additionally, the additional parasitic capacitance of transistor switches 714 and 716 is small. Further, since the resistors 710 and 712 are designed to cover most of the resistance in the off-state, variation of the characteristics of the transistor switches 714 and 716 are not significant. The bias level $V_A$ determines the common level in the off-state and can have any value from ground to supply voltage. Thus, the bias level $V_A$ can be generated from a simple bias generator such as a resistor divider. $V_A$ can also be ground or supply voltage itself.

Figure 8:
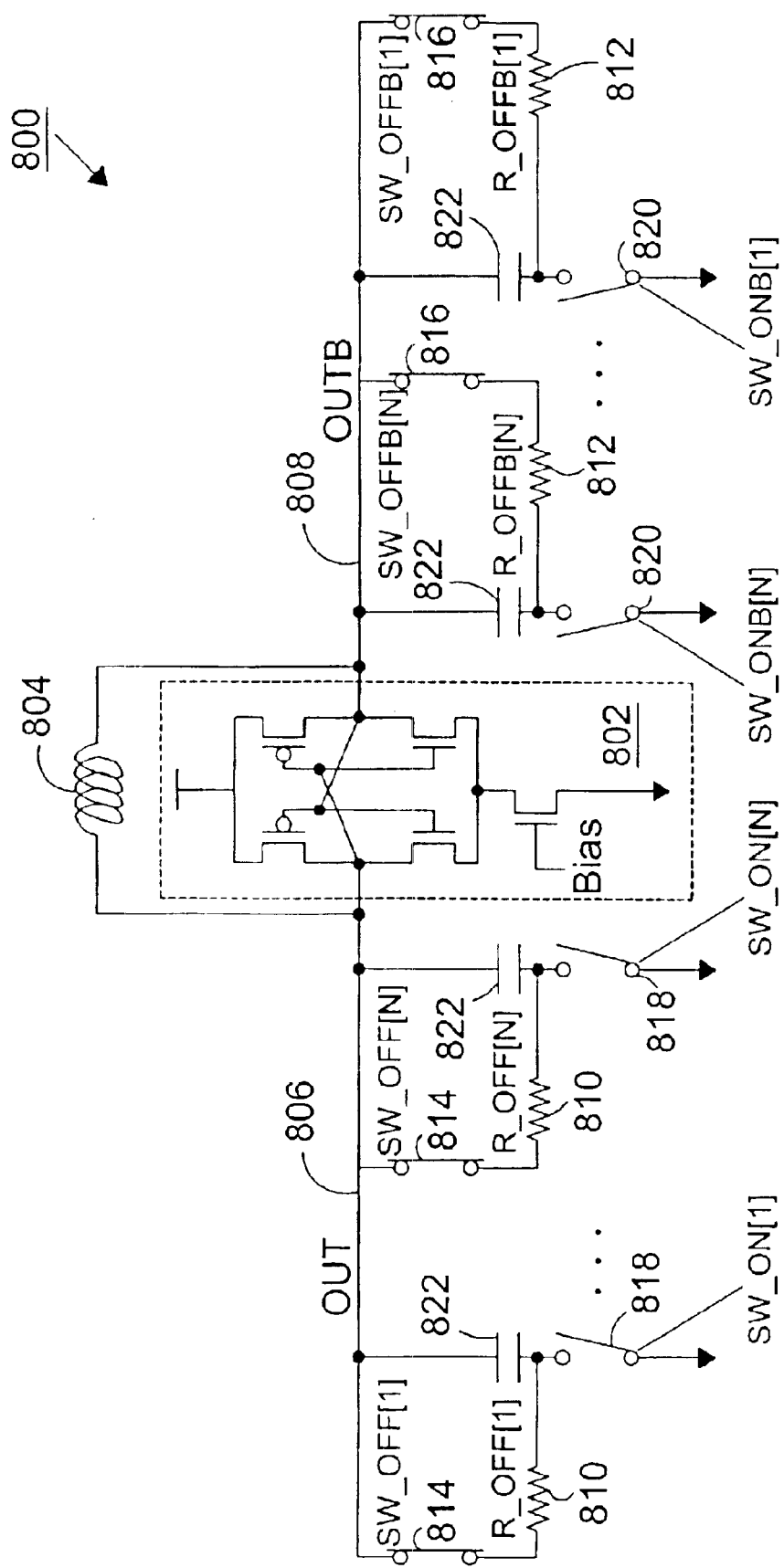
FIG. 8 is a schematic diagram of a voltage-controlled oscillator according embodiments of to the present invention.

FIG. 8 is a schematic diagram showing a voltage-controlled oscillator (VCO) according to embodiments of the present invention. A VCO 800 preferably includes active oscillator circuitry 802. The VCO 800 as shown in FIG. 8 is a differential implementation having output nodes OUT 806 and OUTB 808. An inductor 804 is preferably coupled between the output nodes OUT 806 and OUTB 808. A series circuit including a capacitor 822, a resistance shown as an explicit resistor 810, and a switch 814 or the like (e.g., a transistor) is preferably coupled to the output node OUT 806 at one terminal of the capacitor 822 and one terminal of the transistor switch 814, which are opposite ends of the series circuit. In addition, a switch 818 or the like (e.g., a transistor) is preferably coupled between a reference voltage being ground and a common node of the capacitor 822 and the resistor 810. Similar circuits may be coupled to the output node OUTB 808. For example, a series circuit including capacitor 822, resistor 812, and transistor switch 816 may be coupled to the output node OUTB 808 through one terminal of capacitor 822 and a terminal of transistor switch 816 with the series circuit positioned therebetween. Preferably, transistor switch 820 is coupled between ground and a common node of the capacitor 822 and the resistor 812. Those skilled in the art will appreciate that capacitors 822 can have the same or different values. Likewise, the related resistors and switches can have the same or different values as determined by the specific design requirements of each application.

In the embodiment shown in FIG. 8, there is no need for additional biasing circuitry during the off state. Instead, the common mode voltage of the active circuitry in the LC oscillator provides a proper DC bias to the other terminal of the capacitor not connected to the oscillator output. Also, in VCO 800, a size of transistor switches 814 and 816 can be very small. Thus, the additional parasitic capacitance of transistor switches 814 and 816 is not significant.

Figure 9:
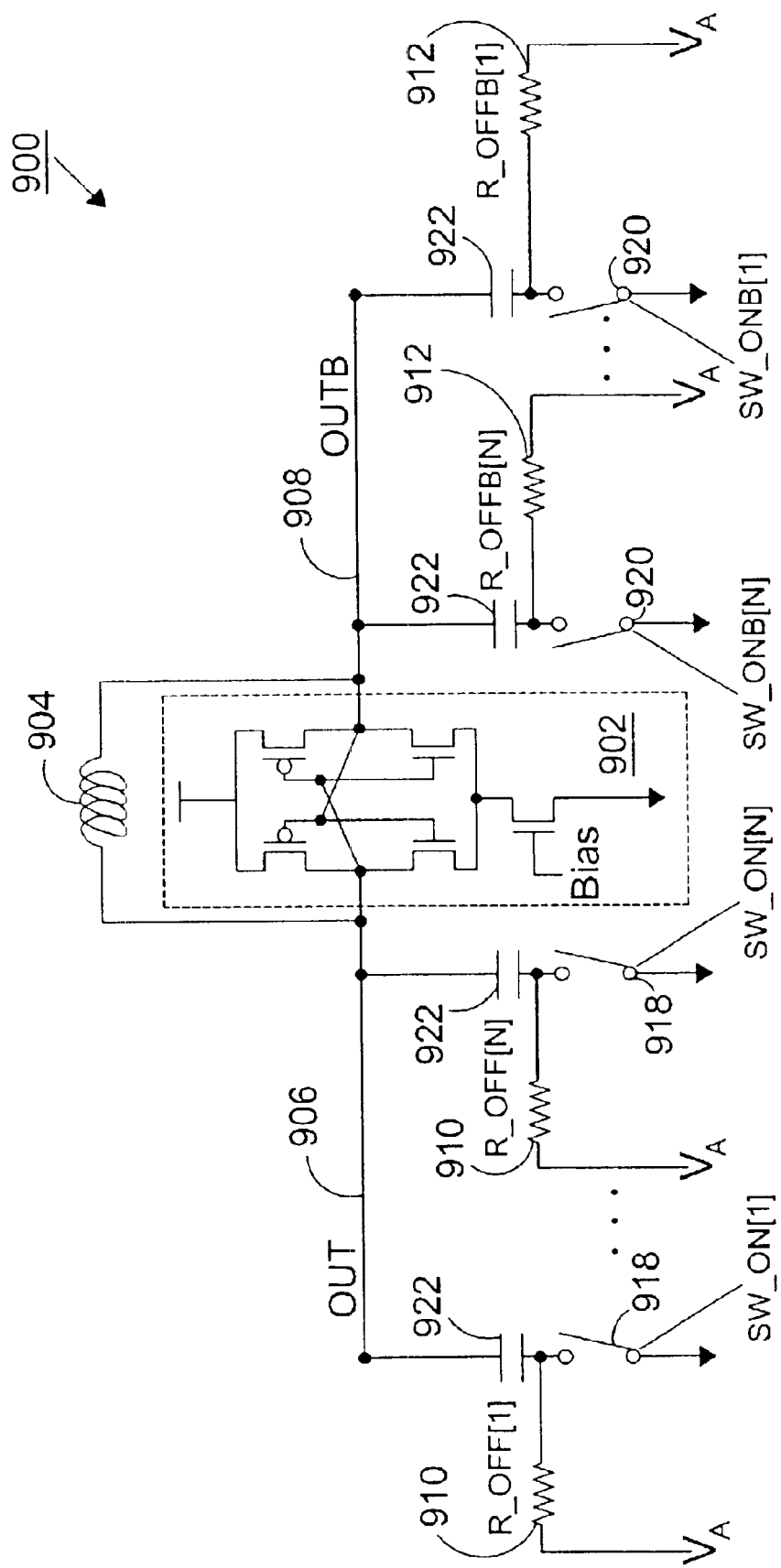
FIG. 9 is a schematic diagram of a voltage-controlled oscillator according embodiments of to the present invention.

FIG. 9 is a schematic diagram showing a voltage-controlled oscillator according to embodiments of the present invention. A VCO 900, as shown in FIG. 9, preferably includes active oscillator circuitry 902. The VCO 900 of FIG. 9 is also in a differential configuration, having output nodes OUT 906 and OUTB 908. Inductor 904 is preferably coupled between the output nodes OUT 906 and OUTB 908. In addition, a capacitor 922 is preferably coupled in series with a switch 918 (e.g., a transistor), where a remaining terminal of capacitor 922 is coupled to the output node OUT 906 and a remaining terminal of transistor switch 918 is coupled to ground. Preferably, there is an explicit resistance preferably being resistor 910 coupled between a common node of the capacitor 922 and the transistor switch 918, and a bias voltage $V_A$. Similar circuits are preferably coupled to OUTB 908. For example, a capacitor 922 is preferably serially coupled with transistor switch 920, where a remaining terminal of the capacitor 922 is coupled to the output node OUTB 908, and a remaining terminal of the transistor switch 920 is coupled to ground. Preferably, an explicit resistor 912 is coupled between a bias voltage VA and a common node of the capacitor 922 and the transistor switch 920. Those skilled in the art will appreciate that capacitors 922 can have the same or different values. Likewise, the related resistors and switches can have the same or different values as determined by the specific design requirements of each application.

In the embodiment shown in FIG. 9, turn-off switches (e.g., switches 814 and 816 in FIG. 8) are eliminated with reduced or limited loss of performance. This is because the resistances of explicit resistors 910 and 912 are selected so that they do not severely change the operating characteristics during the on periods of switches 918 and 920. Those skilled in the art will appreciate that the appropriate values for resistors 910 and 912 are determined empirically for a given oscillator design (e.g., capacitance, frequency range, and the like). When switches 918 and 920 are opened to reduce the capacitance, the other terminal not coupled to the oscillator output preferably has its DC bias voltage substantially the same as the common mode voltage of the oscillator 902.

The above-described embodiments can be used in receiver and PLL circuits described in the related art. Further, those skilled in the art will appreciate that embodiments of the present invention can be used in any device that uses or can use a PLL or VCO. For example, embodiments of the invention can include a PLL, a receiver, a transmitter, a transceiver, a wireless communication device, a base station, or a mobile unit (e.g., cellular phones, PDA's, pagers, and the like).

As described above, preferred embodiments of a VCO circuit and method have various advantages. The preferred embodiments provide an increased tuning range of a PLL. Further, the preferred embodiments reduce or eliminate problems associated with turn-on and turn-off conditions of the VCO adjusting circuitry. In addition, the size of the transistor switches can be reduced.

Additionally, those skilled in the art will recognize methods disclosed in the foregoing description for tuning a device having an oscillator circuit. For example, the methods comprise providing a bias voltage via a bias resistor to a reactive element so that the reactive element has a bias voltage when a first switch is open, using the first switch to couple or decouple the reactive element from the oscillator circuit and coupling, the bias resistor to the bias voltage with a second switch. Further, the method can include opening the second switch if the first switch is closed and closing the second switch if the first switch is open. The method can be applied to a variety of devices such as a PLL, a receiver, a transmitter, a transceiver, a wireless communication device, a base station, and/or a mobile unit.

The foregoing embodiments and advantages are merely exemplary and are not to be construed as limiting the present invention. The invention can be readily applied to other types of apparatuses, as will be appreciated by those skilled in the art. Many alternatives, modifications, and variations will be apparent to those skilled in the art.

What is claimed is:

1. A system comprising:
   at least one adjusting circuit operably coupled to an oscillator, wherein the adjusting circuit comprises:
   a resistor;
   a reactive element;
   a first switch, wherein the first switch is electrically connected to the reactive element and couples and decouples the reactive element to an output of the oscillator based on a control signal, and wherein the resistor provides a bias voltage to the reactive element so that the reactive element has a bias voltage when the first switch is open; and
   a second switch, wherein the second switch couples the resistor to the bias voltage based on the control signal when the first switch decouples the reactive element and the second switch decouples the resistor from the bias voltage when the first switch couples the reactive element.

2. The system of claim 1, wherein the reactive element is a capacitor.

3. The system of claim 1, wherein the bias voltage is at least one of a voltage generated from a resistor divider, a ground voltage, a supply voltage, and a common mode voltage of the oscillator output.

4. The system of claim 3, wherein the bias voltage from the resistor divider ranges from a ground voltage to a supply voltage.

5. The system of claim 1, wherein the resistor is sized so that the bias voltage can be constantly coupled to the resistor and so that the bias voltage does not substantially change the operating characteristics of the at least one adjusting circuit when the first switch is closed.

6. The system of claim 1, wherein the first switch is a semiconductor device.

7. The system of claim 1, wherein the first switch is a transistor and the second switch is a transistor that is smaller than the first switch.

8. The system of claim 1, further comprising a plurality of adjusting circuits.

9. The system of claim 8, wherein each reactive element in each of the plurality of adjusting circuits is a capacitor, and wherein the capacitance of each capacitor is the same.

10. The system of claim 1, wherein the system is at least one of an active oscillator circuit, a PLL, a receiver, a transmitter, a transceiver, a wireless communication device, a base station, and a mobile unit.

11. An apparatus comprising:
an active oscillator, wherein the active oscillator comprises a first output node and a second output node;
an inductor, wherein the inductor couples the first output node and the second output node; and
at least one capacitive circuit coupled to either the first output node or the second output node, the at least one capacitive circuit comprising a capacitor; a resistor; and a first switch, wherein the resistor provides a bias voltage to the capacitor when the first switch is open and wherein the first switch is in series with the capacitor and couples and decouples the capacitor to the output of the oscillator, wherein the capacitor couples the first switch to either the first or second output node, the first switch couples the capacitor to a ground voltage level, and the resistor is coupled to the capacitor and the first switch at a common node of the capacitor and first switch.

12. The apparatus of claim 11, wherein the bias voltage is at least one of a voltage generated from a resistor divider, a ground voltage, a supply voltage, and a common mode voltage of the oscillator output.

13. The apparatus of claim 11, wherein the at least one capacitive circuit comprises a second switch and the second switch couples and decouples the resistor to the bias voltage.

14. The apparatus of claim 13, wherein the second switch and resistor are in series, and wherein the bias voltage is a common mode voltage of the oscillator output.

15. The apparatus of claim 13, wherein the at least one capacitive circuit is configured such that:
if the first switch is open then the second switch is closed; and
if the first switch is closed then the second switch is open.

16. The apparatus of claim 11, wherein the apparatus is at least one of a PLL, a receiver, a transmitter, a transceiver, a wireless communication device, a base station, and a mobile unit.

17. A method for adjusting an oscillator, the method comprising:
providing a bias voltage via a resistor to a reactive element so that the reactive element has a bias voltage when a first switch is open;
using the first switch to couple and decouple the reactive element to an output of oscillator based on a control signal, thereby adjusting the frequency of the oscillator;
coupling the resistor to the bias voltage via a second switch when the first switch decouples the reactive element; and
decoupling the resistor from the bias voltage via the second switch when the first switch couples the reactive element.

18. A system comprising:
at least one adjusting circuit operably coupled to an oscillator, wherein the adjusting circuit comprises:
a resistor;
a reactive element;
a first switch, wherein the first switch is electrically connected to the reactive element and couples and decouples the reactive element to an output of the oscillator, wherein the resistor provides a bias voltage to the reactive element so that the reactive element has a bias voltage when the first switch is open, wherein the bias voltage is generated from a resistor divider and ranges from a ground voltage to a supply voltage.

19. The system of claim 18, further comprising:
a second switch,
wherein the second switch couples and decouples the resistor to the bias voltage when the first switch decouples the reactive element and decouples the resistor from the bias voltage when the first switch couples the reactive element.

20. The system of claim 18, wherein the resistor is sized so that the bias voltage can be constantly coupled to the resistor and so that the bias voltage does not substantially change the operating characteristics of the adjusting circuit when the first switch is closed.

21. An apparatus comprising:
an active oscillator including a first and second output nodes;
an inductor coupled between the first and second output nodes; and
at least one capacitive circuit coupled to either the first output node or the second output node, the at least one capacitive circuit comprising: a capacitor; a resistor; and a first switch,
wherein the resistor provides a bias voltage to the capacitor when the first switch is open, wherein the first switch is electrically connected to the capacitor and couples and decouples the capacitor to the output of the oscillator based on a control signal, and wherein the at least one capacitive circuit comprises a second switch and the second switch couples and decouples the resistor to the bias voltage.

22. The apparatus of claim 21, wherein the second switch and resistor are in series, and wherein the bias voltage is a common mode voltage of the oscillator output.

23. The apparatus of claim 21, wherein the at least one capacitive circuit is configured such that:
if the first switch is open then the second switch is closed; and
if the first switch is closed then the second switch is open.

24. An apparatus, comprising:
at least one reactive element;
a first switch circuit to selectively couple the reactive element to an output of an oscillator based on a control signal; and
a second switch circuit to couple the reactive element to a bias voltage when the first switch circuit decouples the reactive element from the oscillator output, wherein the reactive element tunes an output frequency of the oscillator output when the first switch couples the reactive element to the oscillator.

25. The apparatus of claim 24, wherein the second switch circuit couples the reactive element to the bias voltage through at least one resistive element.

26. The apparatus of claim 24, wherein the second switch circuit decouples the reactive element from the bias voltage when the first switch circuit couples the reactive element to the oscillator output.

27. The apparatus of claim 24, wherein the first switch circuit is connected between the reactive element and a reference potential.

28. The apparatus of claim 27, wherein the reference potential is ground.

29. The apparatus of claim 24, wherein the bias voltage is lower than a voltage stored in the reactive element at a time when the first switch circuit decouples the reactive element from the oscillator output.

30. The apparatus of claim 24, wherein the bias voltage is higher than a voltage stored in the reactive element at a time when the first switch circuit decouples the reactive element from the oscillator output.

31. The apparatus of claim 24, wherein the bias voltage causes voltage stored in the reactive element to at least partially discharge at a time when the first switch circuit decouples the reactive element from the oscillator output.

32. The apparatus of claim 24, wherein the bias voltage is a reference potential.

33. The apparatus of claim 32, wherein the reference potential is ground.

34. The apparatus of claim 24, wherein the bias voltage is a supply potential.

35. The apparatus of claim 24, wherein the bias voltage is a common mode voltage of the oscillator.

36. The apparatus of claim 24, wherein the bias voltage lies in a range between a reference potential and a supply potential.

37. A method, comprising:
operating a first switch circuit to couple a reactive element to an output of an oscillator based on a control signal; and
operating a second switch circuit to couple the reactive element to a bias voltage when the first switch circuit decouples the reactive element from the oscillator output, wherein the reactive element tunes an output frequency of the oscillator when the reactive element is coupled to the oscillator output.

38. The method of claim 37, wherein the second switch circuit couples the reactive element to the bias voltage through at least one resistive element.

39. The method of claim 37, wherein the second switch circuit decouples the reactive element from the bias voltage when the first switch circuit couples the reactive element to the oscillator output.

40. The method of claim 37, wherein the first switch circuit is connected between the reactive element and a reference potential.

41. The method of claim 40, wherein the reference potential is ground.

42. The method of claim 37, wherein the bias voltage is lower than a voltage stored in the reactive element at a time when the first switch circuit decouples the reactive element from the oscillator output.

43. The method of claim 37, wherein the bias voltage is higher than a voltage stored in the reactive element at a time when the first switch circuit decouples the reactive element from the oscillator output.

44. The method of claim 37, wherein the bias voltage causes voltage stored in the reactive element to at least partially discharge when the first switch circuit decouples the reactive element from the oscillator output.

45. The method of claim 37, wherein the bias voltage is a reference potential.

46. The method of claim 45, wherein the reference potential is ground.

47. The method of claim 37, wherein the bias voltage is a supply potential.

48. The method of claim 37, wherein the bias voltage is a common mode voltage of the oscillator.

49. The apparatus of claim 21, wherein the second switch couples and decouples the resistor to the bias voltage based on the control signal.

50. The apparatus of claim 24, wherein the second switch couples and decouples the reactive element to the bias voltage based on the control signal.

* * * * *